United States Patent
Sato et al.

(10) Patent No.: US 8,164,180 B2
(45) Date of Patent: Apr. 24, 2012

(54) FUNCTIONAL ELEMENT PACKAGE AND FABRICATION METHOD THEREFOR

(75) Inventors: Yukito Sato, Sendai (JP); Joerg Froemel, Chemnitz (DE)

(73) Assignees: Ricoh Company, Ltd., Tokyo (JP); Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 180 days.

(21) Appl. No.: 12/531,552

(22) PCT Filed: Mar. 17, 2008

(86) PCT No.: PCT/JP2008/055347
§ 371 (c)(1),
(2), (4) Date: Sep. 16, 2009

(87) PCT Pub. No.: WO2008/123165
PCT Pub. Date: Oct. 16, 2008

(65) Prior Publication Data
US 2010/0072562 A1  Mar. 25, 2010

(30) Foreign Application Priority Data

Mar. 19, 2007 (JP) .................................. 2007-070292
Jan. 24, 2008 (JP) .................................. 2008-013249

(51) Int. Cl.
*H01L 29/84* (2006.01)
(52) U.S. Cl. ............... 257/704; 257/415; 257/E23.181; 438/51; 438/52; 438/106
(58) Field of Classification Search .................. 257/704, 257/710, E23.181, E23.193, 414, 415, 678; 438/51, 52, 106
See application file for complete search history.

(56) References Cited

U.S. PATENT DOCUMENTS

| 4,079,508 | A | * | 3/1978 | Nunn ............................. 438/51 |
| 5,223,741 | A | * | 6/1993 | Bechtel et al. ............... 257/678 |
| 5,315,486 | A | * | 5/1994 | Fillion et al. ................. 361/795 |
| 5,915,168 | A | * | 6/1999 | Salatino et al. ............... 438/110 |
| 6,100,594 | A | * | 8/2000 | Fukui et al. ................... 257/777 |

(Continued)

FOREIGN PATENT DOCUMENTS

JP  2004-248243  9/2004

(Continued)

OTHER PUBLICATIONS

"MEMS Packaging", Fraunhofer Institut Zuverlassigkeit und Mikrointegration IZM, www.izm.fraunhofer.de.

(Continued)

*Primary Examiner* — Victor A Mandala
*Assistant Examiner* — William Harriston
(74) *Attorney, Agent, or Firm* — Cooper & Dunham LLP

(57) ABSTRACT

A functional element package includes a silicon substrate with a functional element having one of a mobile portion and a sensor thereon; a seal member being bonded with the silicon substrate to form an airtightly sealed space therein, and including a step portion in its height direction; a first wiring portion being connected with the functional element and extending from the airtightly sealed space to an outside thereof; a second wiring portion being different from the first wiring portion and extending from the step portion to an upper surface of the seal member; and a bump on the second wiring portion, in which the first wiring portion is bent towards the airtightly sealed space and connected via a photoconductive member with the second wiring portion on the step portion.

17 Claims, 12 Drawing Sheets

U.S. PATENT DOCUMENTS

| | | | |
|---|---|---|---|
| 6,124,546 A * | 9/2000 | Hayward et al. | 174/524 |
| 6,214,644 B1 * | 4/2001 | Glenn | 438/108 |
| 6,235,554 B1 * | 5/2001 | Akram et al. | 438/109 |
| 6,291,884 B1 * | 9/2001 | Glenn et al. | 257/747 |
| 6,342,406 B1 * | 1/2002 | Glenn et al. | 438/57 |
| 6,441,481 B1 * | 8/2002 | Karpman | 257/711 |
| 6,465,280 B1 * | 10/2002 | Martin et al. | 438/125 |
| 6,518,501 B1 * | 2/2003 | Kawahara et al. | 174/538 |
| 6,526,653 B1 * | 3/2003 | Glenn et al. | 29/830 |
| 6,559,530 B2 * | 5/2003 | Hinzel et al. | 257/684 |
| 6,630,725 B1 * | 10/2003 | Kuo et al. | 257/659 |
| 6,762,937 B2 * | 7/2004 | Kimoto et al. | 361/699 |
| 6,764,875 B2 * | 7/2004 | Shook | 438/106 |
| 6,777,819 B2 * | 8/2004 | Huang | 257/796 |
| 6,849,916 B1 * | 2/2005 | Glenn et al. | 257/434 |
| 6,888,209 B2 * | 5/2005 | Jobetto | 257/459 |
| 7,002,225 B2 * | 2/2006 | Stewart | 257/414 |
| 7,009,295 B2 * | 3/2006 | Noguchi | 257/738 |
| 7,143,568 B2 * | 12/2006 | Van Heerden et al. | 53/486 |
| 2001/0009300 A1 * | 7/2001 | Sugimura | 257/693 |
| 2001/0022382 A1 * | 9/2001 | Shook | 257/415 |
| 2003/0006502 A1 * | 1/2003 | Karpman | 257/711 |
| 2003/0092229 A1 * | 5/2003 | Silverbrook | 438/200 |
| 2003/0151139 A1 * | 8/2003 | Kimura | 257/737 |
| 2004/0056340 A1 * | 3/2004 | Jobetto | 257/678 |
| 2004/0061207 A1 * | 4/2004 | Ding | 257/678 |
| 2004/0077117 A1 * | 4/2004 | Ding et al. | 438/51 |
| 2004/0086011 A1 * | 5/2004 | Bhandarkar | 372/43 |
| 2004/0115866 A1 * | 6/2004 | Bang et al. | 438/125 |
| 2004/0145278 A1 | 7/2004 | Iwamoto | |
| 2004/0259325 A1 * | 12/2004 | Gan | 438/456 |
| 2005/0017313 A1 * | 1/2005 | Wan | 257/415 |
| 2005/0017348 A1 * | 1/2005 | Haba et al. | 257/704 |
| 2005/0073040 A1 * | 4/2005 | Lee et al. | 257/698 |
| 2005/0104179 A1 * | 5/2005 | Zilber et al. | 257/684 |
| 2005/0104204 A1 | 5/2005 | Kawakubo et al. | |
| 2005/0133932 A1 * | 6/2005 | Pohl et al. | 257/777 |
| 2005/0167795 A1 * | 8/2005 | Higashi | 257/678 |
| 2006/0001114 A1 * | 1/2006 | Chen et al. | 257/415 |
| 2006/0033189 A1 * | 2/2006 | Haba et al. | 257/678 |
| 2006/0113549 A1 * | 6/2006 | Den et al. | 257/79 |
| 2006/0131753 A1 * | 6/2006 | Rantala et al. | 257/759 |
| 2006/0151203 A1 * | 7/2006 | Krueger et al. | 174/260 |
| 2006/0166480 A1 * | 7/2006 | Yun et al. | 438/618 |
| 2006/0192281 A1 * | 8/2006 | Lu et al. | 257/704 |
| 2006/0197215 A1 * | 9/2006 | Potter | 257/704 |
| 2006/0211233 A1 * | 9/2006 | Gan et al. | 438/613 |
| 2006/0273430 A1 * | 12/2006 | Hua et al. | 257/621 |

FOREIGN PATENT DOCUMENTS

| | | |
|---|---|---|
| JP | 2005-43612 | 2/2005 |
| JP | 2005-109221 | 4/2005 |
| JP | 2005-341162 | 12/2005 |
| JP | 2006-196619 | 7/2006 |
| JP | 2006-303061 | 11/2006 |

OTHER PUBLICATIONS

Petersen, Kurt E., "Silicon Torsional Scanning Mirror", IBM Journal of Res. Development, vol. 24, No. 5, pp. 631-637, Sep. 1980.

* cited by examiner

FUNCTIONAL ELEMENT PACKAGE AND FABRICATION METHOD THEREFOR

CROSS REFERENCE TO RELATED APPLICATIONS

The present application is based on and claims priority from Japanese Patent Application No. 2007-70292, filed on Mar. 19, 2007, and No. 2008-13249, filed on Jan. 24, 2008, the disclosure of which is hereby incorporated by reference in its entirety.

TECHNICAL FIELD

This disclosure relates to a functional element package having a mobile portion or a sensor and to which Micro Electro Mechanical Systems (MEMS) technology is applied, as well as to a fabrication method therefor.

BACKGROUND ART

There has been a known MEMS device in which a functional element with a mobile portion or a sensor is formed on a silicon substrate by micromachining process. The MEMS device can be collectively manufactured on a silicon substrate by a semiconductor process so that downsizing thereof is easily feasible. Also, it has various advantages such as multifunction, lower power consumption, low cost, reliability, which has been leading to new aggressive developments in the recent years.

The MEMS device has been in practical use for various components of acceleration sensor, angular velocity sensor, inclination sensor, flow sensor, pressure sensor mounted in automobiles and cellular phones, optical switch for display, optical scanner for projectors, and so on, or sample products thereof have been developed.

The functional element is composed of a silicon microstructure as a thin film or a micro gap, and a minute wiring. Because of this, operation of the functional element is susceptible to variances in external temperature or humidity or particle variation or contamination. For the purpose of protecting it from such external changes to maintain stable operation, it is airtightly sealed by packaging and completely secluded from the outside environment.

The airtightly sealed space inside the functional element may be depressurized or filled with inert gas, for example, depending on types of the functional element. Generally, in MEMS device used for angular velocity sensor, optical scanner or the like with high-speed vibration, the airtightly sealed space is depressurized in order to reduce viscosity resistance of gaseous matter which acts on the operation of the device.

The airtightly sealed packaging is required to have such functions and forms as to protect the functional element inside and maintain its performance as well as to be small in size and easily mountable, and place outside the airtightly sealed space an electrode to drive the functional element by static electricity, electromagnetic power, piezo element or the like.

Japanese Laid-open Patent Application Publication No. 2005-109221 and No. 2005-341162 disclose known methods for mounting the packaged MEMS device on the print circuit board by wire bonding or flip-chip bonding.

FIGS. 1A, 1B show an example of packaging by wire bonding. The drawings show a silicon substrate 1, a functional element 2 having a mobile portion or a sensor on the silicon substrate 1, a seal member 3, a wiring portion 4 extending from the functional element 2, and an airtightly sealed space 5.

The wiring portion 4 is made of a part of the silicon substrate 1 which is insulated therefrom by an oxide film, slits or the like. The wiring portion 4 extends from the airtightly sealed space 5 to an outside through a bonding plane with the seal member 3. An electrode pad 6 and a bonding wire 7 are formed on an upper exposed portion 4' of the wiring portion 4 outside the airtightly sealed space 5. The bonding wire 7 has been widely used owing to its wiring flexibility and reliable, low-cost mountability on a not-shown print board circuit or the like.

FIG. 2 shows an example of packaging by flip-chip bonding. The drawing shows a silicon substrate 11, a functional element 12 having a mobile portion or a sensor on the silicon substrate 11, a seal member 13, wiring portions 14 extending from the functional element 12, and an airtightly sealed space 15.

The wiring portions 14 are each made of a part of the silicon substrate 11 which is insulated therefrom by an oxide film, slits or the like. Wiring portions 16 penetrate through the silicon substrate 11 to extend to an outside thereof. Under bump metals 17 and bumps 18 are formed on the extending wiring portions 16.

According to the flip-chip bonding, the wiring portions 16 extending from the functional element 12 are disposed on the surface of the packaged MEMS device so that it is possible to reduce the area in which the MEMS device is packaged on a print board or the like, unlike the wire bonding by which the wiring portion is laid around the periphery of the chip of the MEMS device.

Note that the applicant of the present invention filed a similar patent application (Japanese Laid-open Patent Application Publication No. 2005-43612) to the present application, which discloses an optical scan apparatus in which an electrode pad for an airtightly sealed vibration mirror is electronically connected with a lead terminal of a base substrate via a solder ball.

There is a problem in the wire bonding that since the bonding wire 7 extends towards the outside of the silicon substrate 1 beyond the package area of the MEMS device chip, it is difficult to mount a large number of such MEMS device chips with high density in a minute space between circuit elements on a print circuit board.

Meanwhile, the flip-chip bonding also has some problems. That is, it is hard to form a structure in which the wiring portion 14 extending from the functional element 12 is arranged on the surface of the packaged MEMS device. For embedding an electrode from the airtightly sealed space 15 into the silicon substrate 11 by penetrating therethrough, for example, a leakage may occur therein due to defects on the interface of the embedded electrode and silicon substrate 11, and a difference in thermal expansion coefficients therebetween.

Further, high-density plasma dry etching is used for forming a through hole in the silicon substrate 11. However, the silicon substrate 11 on which the functional element 11 is formed or the seal member 13 bonded with silicon substrate 11 generally have only a very small thickness of several micron meters, therefore, it takes an enormous amount of time for etching them. Thus, fabrication cost for the MEMS device chips are much increased unless a great number of silicon substrates 11 are subjected to the etching process concurrently. Besides, there is a limitation to selection of types and thickness of etching masks with resistance properties.

Moreover, there is another limitation to metal materials used for the electrode and they have to be ones with a low melting point. This is because in order to form the electrode, it is necessary to fill the through hole with a conductive metal material by making melted metal in contact with the through hole under vacuum or by dropping the melted metal thereinto.

In view of solving the above-identified problems, combining the flip-chip bonding with the wire bonding has been proposed to connect the wiring portion with a bump on the surface of the functional element package without formation of the pass-through electrode.

FIGS. 3A, 3B show an example of the combination of flip-chip bonding and wire bonding. The drawings show a functional element package including a silicon substrate 21, a functional element 22 with a mobile portion or a sensor formed on the silicon substrate 21, a seal member 23, wiring portions 24 extending from the functional element 22 and an airtightly sealed space 25.

The wiring portions 24 are each composed of a part of the silicon substrate 21 which is insulated therefrom by an oxide film, a slit or the like. The wiring portions 24 extend from the airtightly sealed space 25 to the outside through the bonding surface of the seal member 23. Electrode pads 26 are formed on upper exposed portions 24' of the wiring portions 24, and another electrode pads 27 are formed on the surface 23' of the seal member 23. On the electrode pads 27 formed are bumps 28.

The electrode pads 26, 27 are connected by bonding wires 29 which are protected by a resin 30.

With such a configuration, it is possible to realize the advantages of the wire bonding as the wiring flexibility and reliability, and that of the flip-chip bonding as keeping the package area within the MEMS device chip at the same time.

However, there still remains a problem in the above combined flip-chip bonding and wire bonding that the resin 30 needed to fix and protect the bonding wire 29 protrudes from the surface 23' of the seal member and stands in the way of mounting the package on a print circuit board via the bumps 28 on the surface 23' (See FIG. 3B). This makes it difficult to set the height of the package on the bump side with precision and reliability. In FIG. 3B, Pr denotes the print circuit board and Pr' denotes wiring portions.

SUMMARY

In an aspect of this disclosure, there is provided a reliable functional element package with a simple configuration which can eliminate various problems when the wire bonding and flip-chip bonding are used together for realizing the wiring flexibility and avoid increase in the packaging area.

According to another aspect, a functional element package comprises a silicon substrate on which a functional element is formed, the functional element having one of a mobile portion and a sensor; a seal member being bonded with the silicon substrate to airtightly seal the functional element and form an airtightly sealed space therein, and including a step portion in its height direction; a first wiring portion being connected with the functional element and extending from the airtightly sealed space to an outside thereof; a second wiring portion being different from the first wiring portion and extending from the step portion to an upper surface of the seal member; and a bump on the second wiring portion on the upper surface of the seal member, in which the first wiring portion extending in the outside is bent towards the airtightly sealed space and connected via a photoconductive member with the second wiring portion on the step portion.

According to another aspect, in the functional element package the photoconductive member is a bonding wire.

According to another aspect in the functional element package the seal member has an inclined peripheral wall from the upper surface to the step portion.

According to another aspect in the functional element package the seal member has an inclined peripheral wall from the upper surface to the step portion, and a vertical peripheral wall from the step portion to an upper exposed portion of the first wiring portion.

According to another aspect in the functional element package the step portion is formed at end of the seal member.

According to another aspect in the functional element package the seal member has a through hole and the step portion is formed around the through hole.

According to another aspect in the functional element package, the bonding wire to connect the second wiring portion on the step portion with the first wiring portion is protected with a resin material, and the resin material is filled into the through hole so as not to protrude from the upper surface of the seal member.

According to another aspect in the functional element package the seal member is made of glass.

According to another aspect in the functional element package the seal member is made of a silicon material.

According to another aspect in the functional element package the airtightly sealed space is depressurized.

According to another aspect in the functional element package the airtightly sealed space is filled with inert gas.

According to another aspect in the functional element package, the silicon substrate on which the functional element is formed is bonded with the seal member via an intermediate adhesive layer.

According to another aspect in the functional element package, the silicon substrate on which the functional element is formed is directly bonded with the seal member.

According to another aspect of this disclosure, a fabrication method is provided for a functional element package comprising a silicon substrate on which a functional element is formed, the functional element having one of a mobile portion and a sensor; a seal member being bonded with the silicon substrate to airtightly seal the functional element and form an airtightly sealed space therein, and including a step portion in its height direction; a first wiring portion being connected with the functional element and extending from the airtightly sealed space to an outside thereof; a second wiring portion being different from the first wiring portion and extending from the step portion to an upper surface of the seal member; and a bump on the second wiring portion on the upper surface of the seal member, in which the first wiring portion extending in the outside is bent towards the airtightly sealed space and connected via a photoconductive member with the second wiring portion on the step portion. The method comprises the step of forming an inclined peripheral wall of the seal member from an upper surface to the step portion by anisotropic wet etching.

According to another aspect, the fabrication method further comprises the step of concurrently forming the airtightly sealed space and the step portion by silicon anisotropic etching.

According to another aspect of this disclosure, another fabrication method for a functional element package is provided which comprises the steps of fabricating a bonded wafer having a large number of functional element packages thereon by bonding a wafer on which a large number of the above-described seal members are formed and a wafer on which a large number of microstructures including a functional element are formed; and cutting the bonded wafer along contours of the functional element packages.

In the functional element package according to a preferable embodiment, the first wiring portion extending in the outside of the airtightly sealed space is bent towards the airtightly sealed space and connected via the photoconductive member with the second wiring portion on the step portion. With such a configuration, the photoconductive member is prevented from being laid outside the functional element package so that it is possible to reliably mount the functional element package on a minute circuit board with higher density at a low cost.

In the functional element package according to another preferable embodiment, by using the bonding wire for the photoconductive member, it is possible to provide a reliable functional element package with a simple configuration which can eliminate the problems of the prior art when the wire bonding and flip-chip bonding are used together for realizing the wiring flexibility and the prevention of increase in the packaging area.

In the functional element package according to another preferable embodiment, the film formation for the second wiring portion is made with a good step coverage so that occurrence of conduction failures can be reduced, thereby realizing reliable packaging.

According to another preferable embodiment, the functional element package is configured that the seal member has the inclined peripheral wall from the upper surface to the step portion, and the vertical peripheral wall from the step portion to the upper exposed portion of the first wiring portion. With such a configuration, the film formation for the second wiring portion is made with a good step coverage so that occurrence of conduction failures can be reduced and the amount of agent filled in the upper exposed portion can be also reduced, thereby realizing an advantageous effect of packaging cost reduction.

In the functional element package according to another preferable embodiment, since the step portion is formed at end of the seal member, it is possible to reduce the fabrication cost of the seal member.

In the functional element package according to another preferable embodiment, the step portion is formed in the through hole of the seal member so that it is able to adjust the amount of filling agents such as resin or conductive agents not to protrude from the through hole. In addition, it is also possible to prevent extraneous filling agents from being accumulated in the step portion around the through hole and protruding from the surface of the seal member, which allows the functional element package to be mounted on the print circuit board with a high precision relative to a height direction.

In the functional element package according to another preferable embodiment, the resin material to protect the bonding wire is filled into the through hole so as not to protrude from the upper surface thereof, which results in further improvements in packaging precision of the functional element on the print circuit board relative to the height direction thereof.

In the functional element package according to another preferable embodiment, since the seal member is made of glass, it is usable for optical functional elements such as optical scanners or optical switches so that applicability of the functional element package can be improved.

In the functional element package according to another preferable embodiment, the seal member is made of silicon, which improves workability thereof and enables provision of high-precision functional element packages at low cost.

In the functional element package according to another preferable embodiment, depressurization of the airtightly sealed space can reduce viscosity resistance of gaseous matter, resulting in achieving advantageous effects of high-speed, high-precision operation of the functional element.

In the functional element package according to another preferable embodiment, the airtightly sealed space is filled with inert gas so that Q (quality) factors to represent resonance characteristic can be suppressed to be low, facilitating operation control of the functional element.

In the functional element package according to another preferable embodiment, since the bonding surfaces of the seal member and the silicon substrate are not required to have high flatness and cleanliness, the functional element package is adoptable for various materials and shapes and forms of the substrate.

In the functional element package according to another preferable embodiment, the silicon substrate and the seal member are directly bonded with each other. Therefore, such functional element package is applicable to an application which requires high distance precision between the seal member and the functional element.

In the fabrication method for the functional element package according to another preferable embodiment, the inclined wall from the upper surface of the seal member to the step portion is formed by anisotropic wet etching, which allows a large number of seal members to be batch processed in the inclined wall formation process and thereby reduces the fabrication cost therefor.

In the fabrication method for the functional element package according to another preferable embodiment, the airtightly sealed space and step portion are concurrently formed by anisotropic etching to the silicon substrate so that a large number of functional element packages are batch processed in a plurality of fabrication processes, thereby substantially reducing the fabrication cost therefor.

According to another preferable embodiment, another fabrication method for the functional element package comprises a step of fabricating a bonded wafer with a large number of functional element packages by bonding a wafer on which a large number of regions equivalent to the seal member are formed and a wafer on which a large number of microstructures including a functional element are formed, and a step of cutting the bonded wafer along contours of the functional element packages to obtain individual functional elements. In this manner, it is possible to collectively bond and process a large number of functional element packages and substantially reduce the fabrication cost therefor.

BRIEF DESCRIPTION OF THE DRAWINGS

FIG. 6I is a cross sectional view of the seal member along the C to C' line in FIG. 7A;

FIG. 9J is a cross sectional view of the seal member along the E to E' line in FIG. 10A;

FIG. 14B shows the two circular wafers bonded.

BEST MODE FOR CARRYING OUT THE INVENTION

Hereinafter, embodiments of the functional element package and a fabrication method therefor will be described with reference to the accompanying drawings.

First Embodiment

Figure 1A:
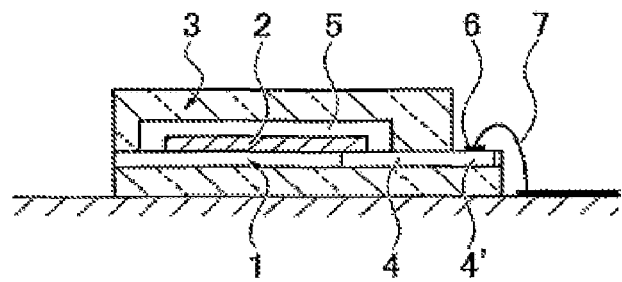
FIG. 1A is a cross sectional view of the prior art functional element package along the A to A' line in FIG. 1B according to one example of packaging by the wire bonding.
Figure 1B:
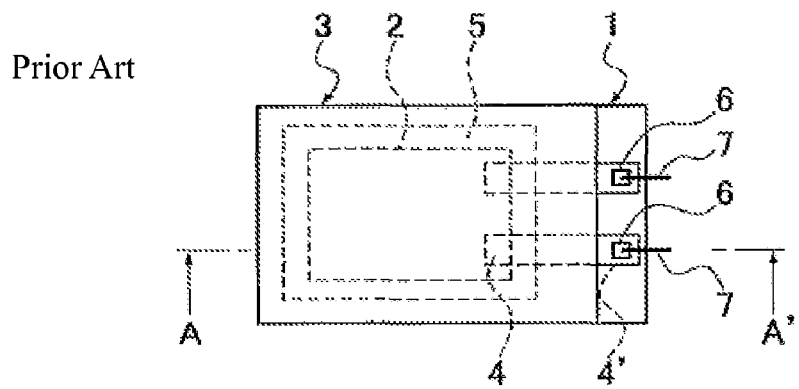
FIG. 1B shows a plain view thereof.
Figure 2:
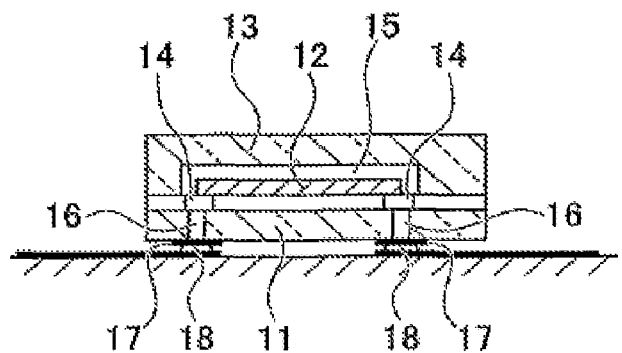
FIG. 2 is a cross sectional view of the prior art functional element package according to one example of packaging by the flip-chip bonding.
Figure 3A:
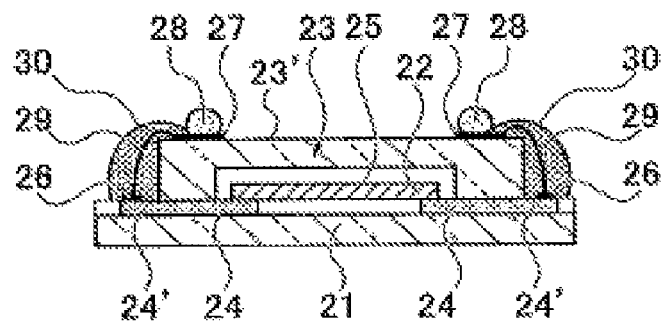
FIG. 3A is a cross sectional view of the prior art functional element package before packaging on a print board according to one example of packaging by both of the wire bonding and flip-chip bonding.
Figure 3B:
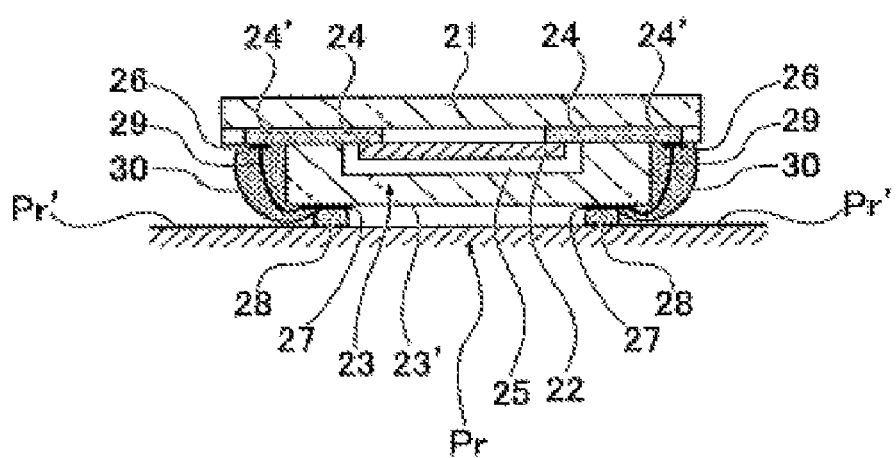
FIG. 3B is a cross sectional view thereof after packaging on a print board.
Figure 4A:
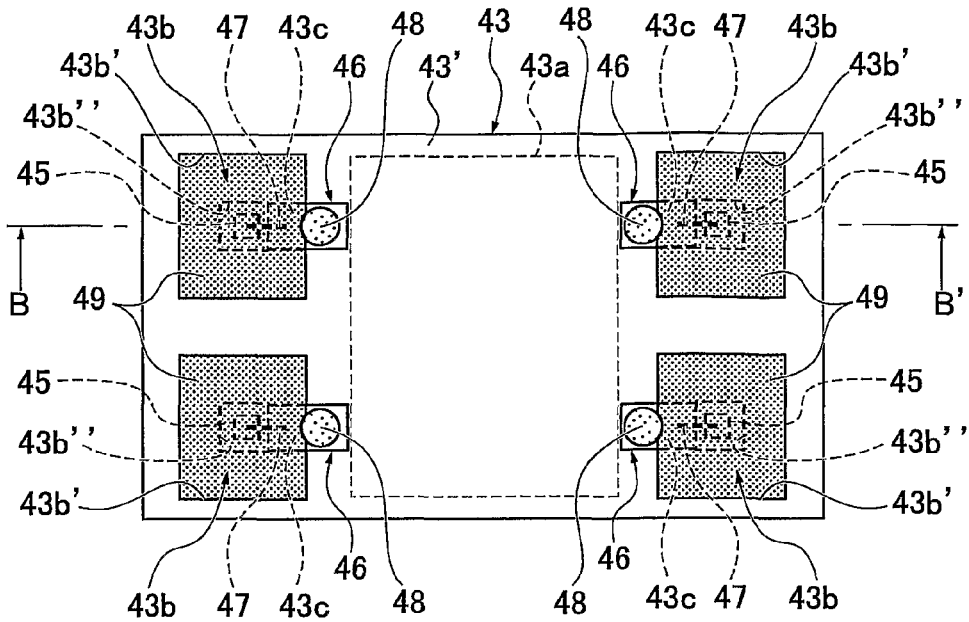
FIG. 4A is a plain view of a functional element package according to a first embodiment of the present invention.
Figure 4B:
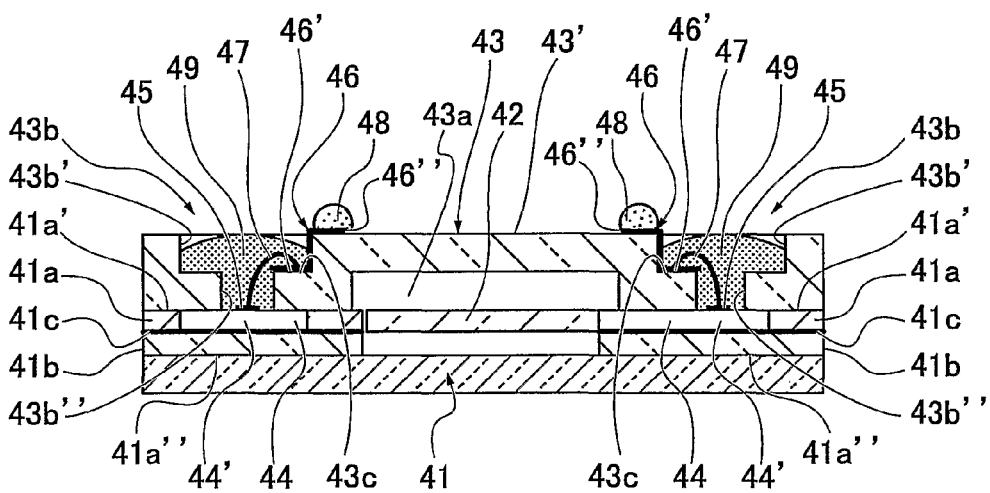
FIG. 4B is a cross sectional view thereof along the B to B' line in FIG. 4A.

FIG. 4B shows a cross sectional view of a functional element package according to the first embodiment of the present invention. The functional element package comprises silicon substrates 41a, 41b which are bonded with each other via a thermal oxide film 41c in thickness of and has total thickness of 200 μm and low electric resistance.

On the silicon substrate 41a a mobile portion 42 is formed by cutting through the silicon substrate 41a by dry etching. A not-shown thermal oxide film in thickness of 1 μm is formed on a surface of a seal member 43 and directly bonded with the silicon substrate 43 via the thermal oxide film. The seal member 43 is made of a silicon substrate in thickness of 525 μm.

The seal member 43 comprises a non-rigid space (airtightly sealed space) 43a having a depth of 200 μm enough for the mobile portion 42 to operate and through holes 43b to place an electrode for driving the mobile portion 42 outside the space. The non-rigid space 43a and through holes 43b are formed by dry etching using high-density plasma.

A bonding surface 41a' of the silicon substrate 41a is bonded with the seal member 43 and a bonding surface 41" of the silicon substrate 41b on the opposite side is anodically bonded with a seal member 41 which is formed of Pyrex® glass substrate with a thickness of 300 μm. The mobile portion 42 is airtightly sealed by the two seal members 43, 41, and the space inside thereof is kept depressurized.

The mobile portion 42 is connected with a wiring portion 44 (first wiring portion) which is made of a silicon substrate with low resistance and insulated from the silicon substrates 41a, 41b by the thermal oxide film 41c and a not-shown slit in width of 50 μm penetrating through the silicon substrate 41a.

The through holes 43b are formed in an area of the seal member 43 excluding the non-rigid space 43a, and each composed of a large opening 43b' and a small opening 43b". The wiring portion 44 partially extends to the outside of the non-rigid space 43a via the bonding surface 41a' of the seal member 43. The part of the wiring portion 44 in the outside of the non-rigid space 43a forms an upper exposed portion 44' facing the small opening 43b". On the upper exposed portion 44' formed is an electrode pad 45 as a thin metal film which is formed by sputtering with a metal mask.

The through holes 43b each have a peripheral wall on which a step portion 43c is formed by dry etching of high-density plasma at a position 200 μm higher than the bonding surface. As shown in FIG. 4A, a connection wiring portion (second wiring portion) 46 is formed as a thin metal film from the step portion 43c to an upper surface 43' of the seal member 43 on a part of the peripheral wall. The connection wiring portion 46 is formed by sputtering with a metal mask.

Figure 4C:
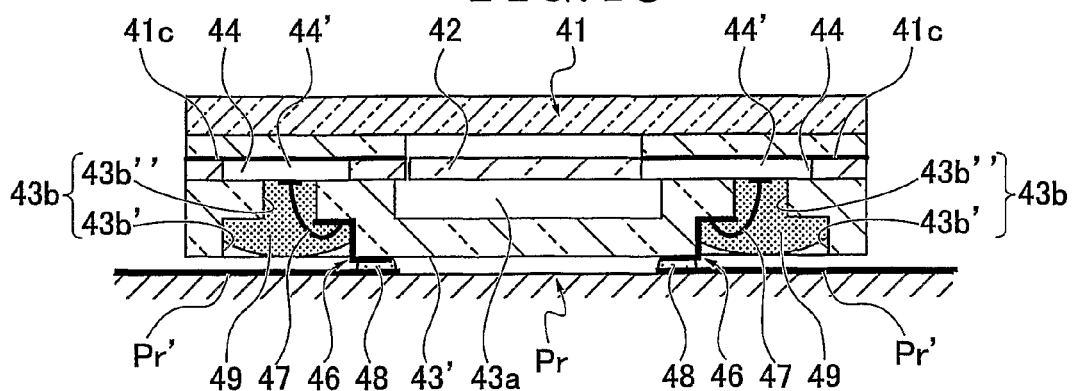
FIG. 4C is a cross sectional view of the functional element package of FIG. 4B on a print board.

A wiring terminal 46' on the step portion 43c is connected with the electrode pad 45 via a bonding wire 47. The through hole 43b is filled with a resin 49 to cover the bonding wire 47. A bump 48 made of Au—Sn alloy is formed on the wiring terminal 46' on the upper surface 43' of the seal member 43. As shown in FIG. 4C, the functional element package is mounted and bonded on the print board Pr via the bump 48. As described above, the wiring portion 44 extending in the outside of the non-rigid space 43a is bent towards the non-rigid space 43a via the bonding wire 47 to be connected with the connection wiring portion 46 on the step portion 43c.

Next, a fabrication method for the seal member 43 with the step portion in FIGS. 4, 5 will be described with reference to FIG. 6.

Figure 6A:
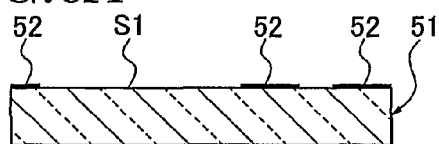
FIGS. 6A to 6K are explanatory views for fabrication process of a seal member of the functional element package according to the first embodiment of the present invention.
Figure 6B:
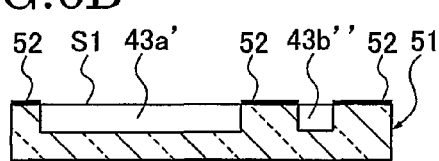

FIG. 6A shows a silicon substrate 51 in thickness of 525 μm with mirror-polished upper and lower surfaces. The upper surface S1 is covered with a patterned resist film. The pattern corresponds with the shapes of the non-rigid space 43a and the small opening 43b". Then, using the resist film as a mask, as shown in 6B, the silicon substrate 51 is subjected to high-density plasma etching with SF6 and C4F8 gases as deep as 200 μm, by which a concavity 43a' corresponding to the non-rigid space 43a and a concavity 43b" (referred to as the same numeric code as the small opening) corresponding to the small opening 43b" are formed.

Figure 6C:
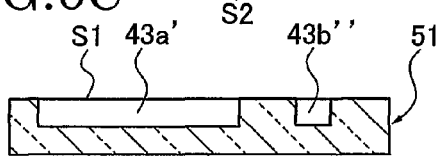
Figure 6D:
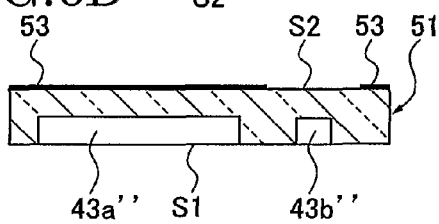

In FIG. 6C the resist film 52 is removed through $O_2$ ashing process. Then, a resist film 53 is formed with a patterning on the other surface S2 of the silicon substrate 51, as shown in FIG. 6D. The pattern thereof corresponds with the shape of the large opening 43b'.

Figure 6E:
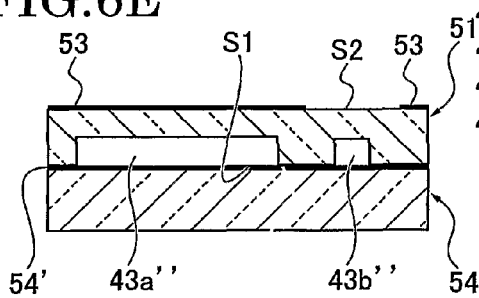
Figure 6F:
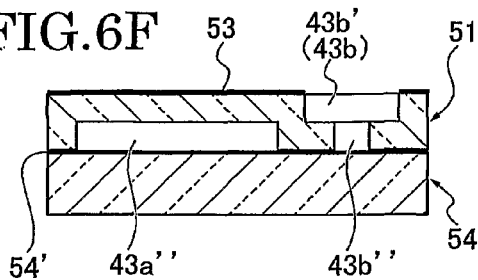

Next, in FIG. 6E, the upper surface S1 of the silicon substrate 51 is attached onto a supplemental silicon substrate 54 with a resist film 54'. In FIG. 6F, using the resist film 53 as a mask, the silicon substrate 51 attached to the supplemental silicon substrate 54 is subjected to high-density plasma etching with SF6 and C4F8 gases as deep as 325 µm. The plasma etching is terminated when formation of the small opening (concave) 43b'' is visually confirmed.

Figure 6G:
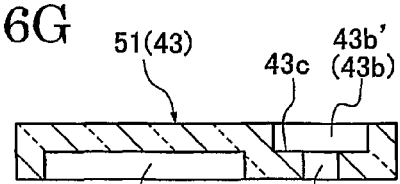
Figure 6H:
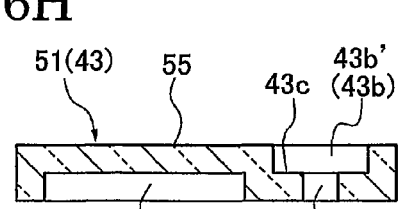

Then, the silicon substrate 51 integrated with the supplemental silicon substrate 54 is immersed in not-shown acetone to remove the supplemental silicon substrate 54 and clean the silicon substrate 51 with the through hole 43b, as shown in FIG. 6G. In FIG. 6H, the silicon substrate 51 is processed in wet $O_2$ at 1000° C., thereby forming a thermal oxide film 55 on the entire surface of the silicon substrate 51. As described above, the step portion 43c is formed through the processes shown in FIGS. 6F to 6H.

Figure 6I:
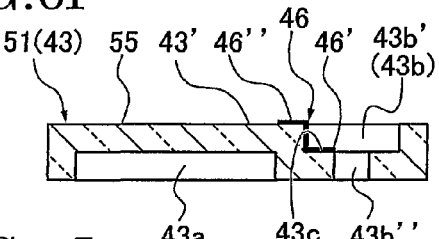
Figure 7A:
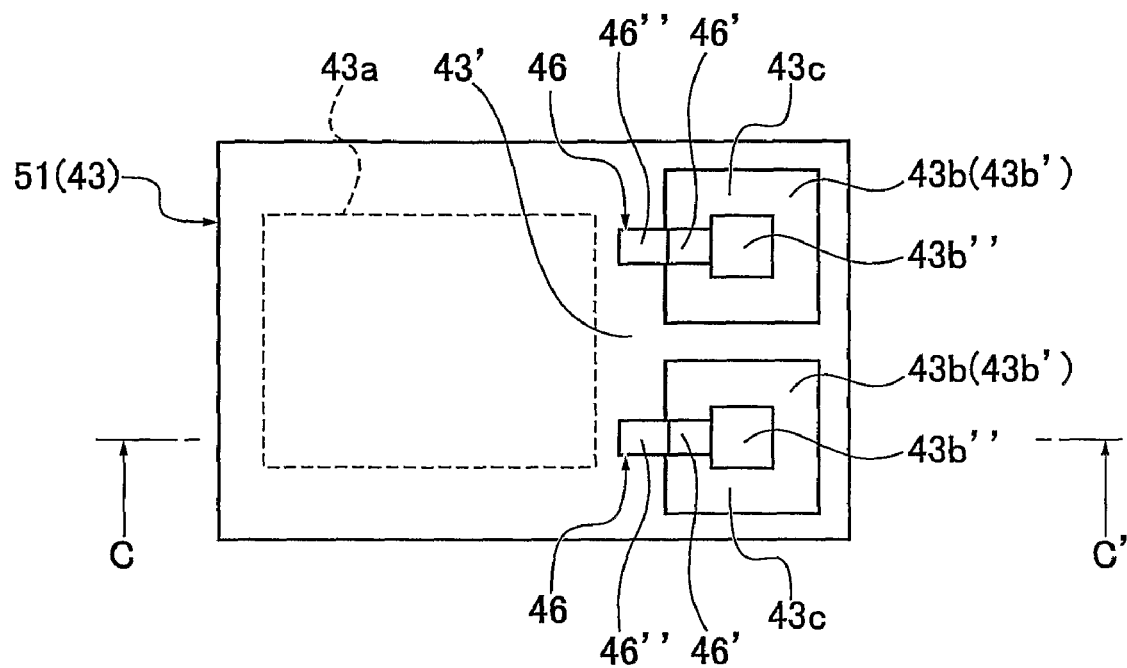
FIG. 7A shows a front surface of the seal member with a connection wiring portion of FIG. 6I.
Figure 7B:
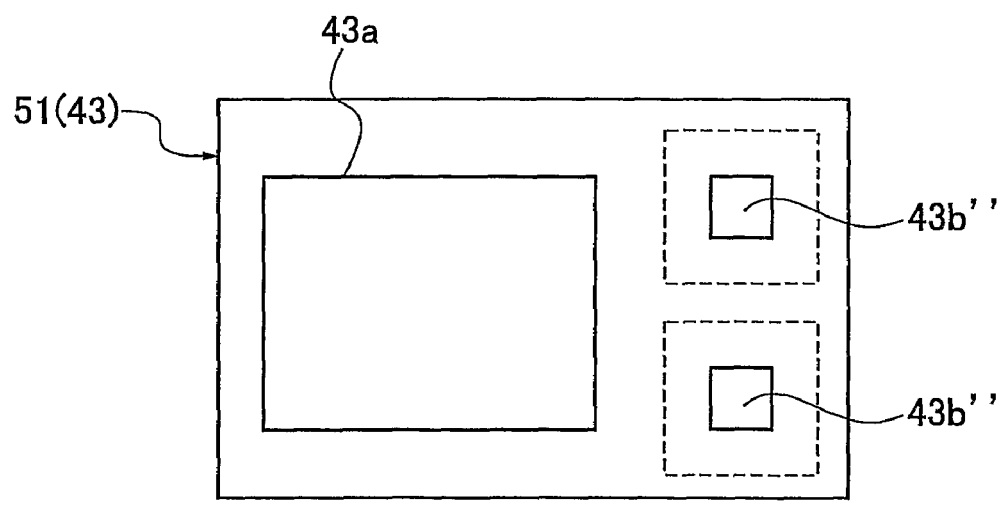
FIG. 7B shows a back surface thereof.

Next, in FIG. 6I the connection wiring portion 46 is formed from the step portion 43c of the through hole 43b to the upper surface 43' of the seal member 43 by sputtering. The connection wiring portion 46 is made of aluminum (Al). In the sputtering process, the area of the seal member 43 excluding the area having the connection wiring portion formed is masked with a metal. FIG. 7A shows the front surface of thus-fabricated silicon substrate 51 and FIG. 7 shows the back surface thereof.

Figure 6J:
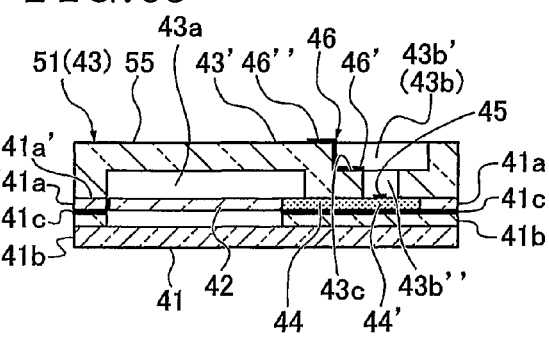

Next, the seal member 43 is bonded with the silicon substrate 41a integrated with the silicon substrate 41b and having a functional element formed thereon. Then, the seal member 41 is bonded with the silicon substrate 41b as shown in FIG. 6J. Here, the seal member 43 is directly bonded with the silicon substrate 41a via the thermal oxide film 55.

In a case where flatness and cleanliness of the bonding surface 41a' cannot be secured sufficiently, however, instead of directly bonding them via the thermal oxide film 55, other ways of bonding, for example, bonding the seal member via an intermediate layer such as glass frit is also adoptable as long as the airtight sealing is achieved. Further, the pressure inside the non-rigid space 43a is arbitrarily settable by adjusting pressure of the bonding atmosphere.

Figure 6K:
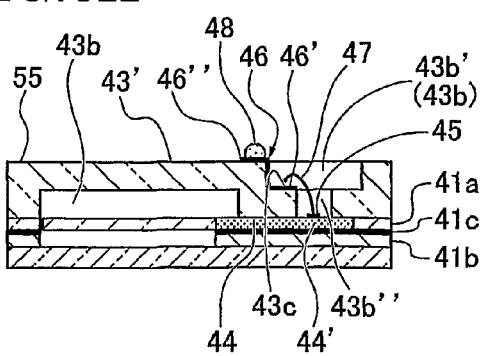

As shown in FIG. 6K, the bump 48 is formed of Au—Sn alloy and the bonding wire 47 is formed. Lastly, the through hole 43b is filled with the resin 49 as shown in FIGS. 4A, 4B. Note that the bump 48 can be formed of Pb/Sn alloy, lead free material (Sn/Ag, Sn/Cu) or the like other than Au—Sn alloy.

Next, modified examples of the functional element package will be described with reference to FIGS. 5A, 5B.

Figure 5A:
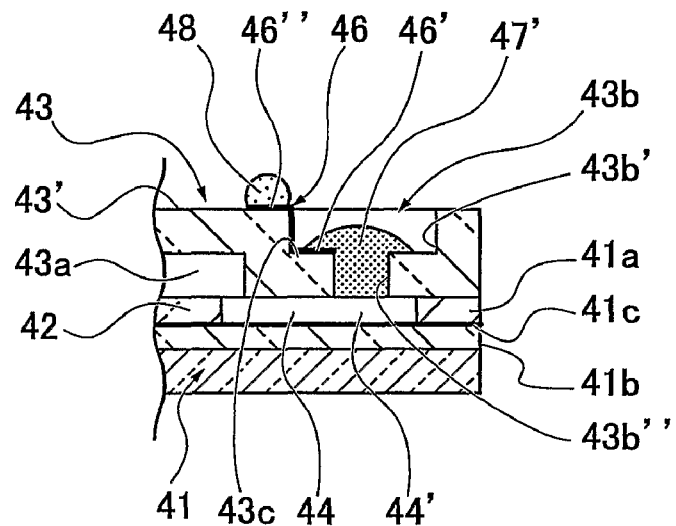
FIG. 5A is a partial cross sectional view of a modification of the functional element package of FIG. 4B

In FIG. 5A, the wiring portion 44 is connected with the connection wiring portion 46, using, as the conductive member 47', a conductive adjective or a thin metal film made by electric gliding in replace of the bonding wire 47.

Figure 5B:
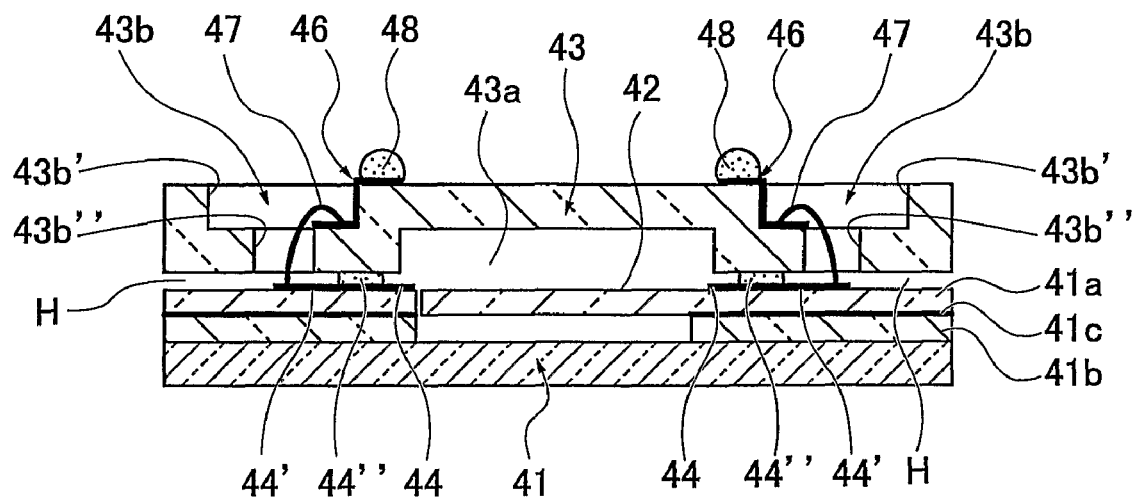
FIG. 5B is a cross sectional view of another modification thereof.

FIG. 5B shows a modified example of how the wiring portion 44 extends from the non-rigid space 43a to the outside. In this example, the wiring portion 44 is made of aluminum (Al), and the silicon substrate 41a is bonded with the seal member 43 via the seal member 44'' which is made of glass with low melting point. With such a configuration, it is able to make a gap H between the seal member 43 and the silicon substrate 41a. At injection of the resin material to protect the bonding wire 47 into the through hole 43b, this allows the resin material to permeate the gap H, thereby preventing the resin material from protruding the upper surface 43' of the seal member 43. As a result, it is able to secure spacing between the seal member 43 and the print circuit board Pr with high precision. Accordingly, the functional element package shown in FIG. 5B is suitable for use in devices with optical functional elements which are required to have high packaging accuracy of the functional elements.

Second Embodiment

Figure 8A:
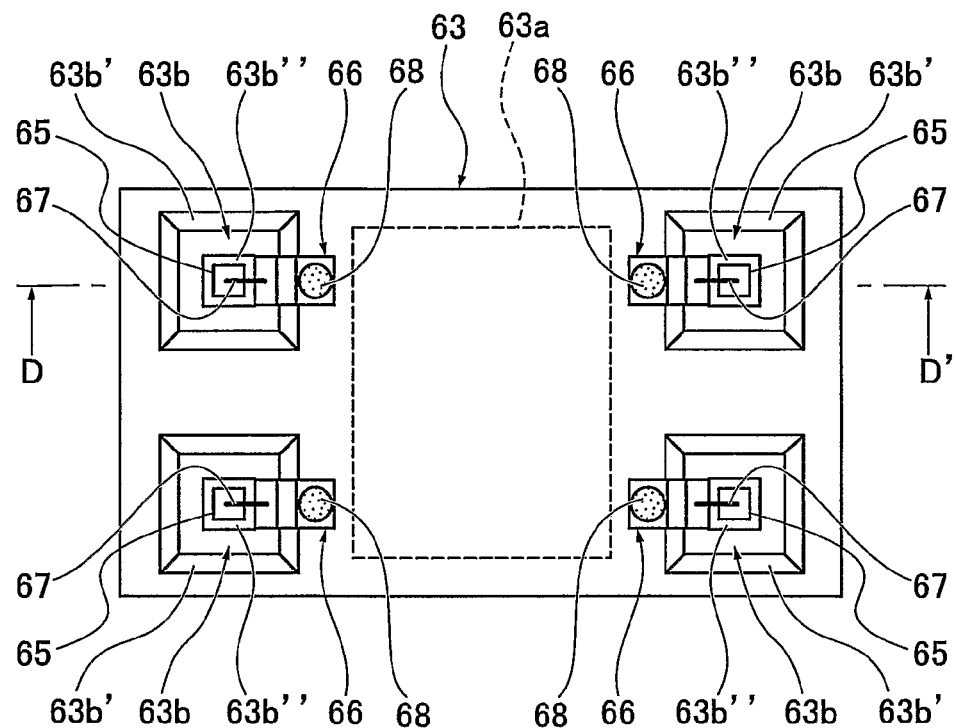
FIG. 8A is a plain view of a functional element package according to a second embodiment of the present invention.
Figure 8B:
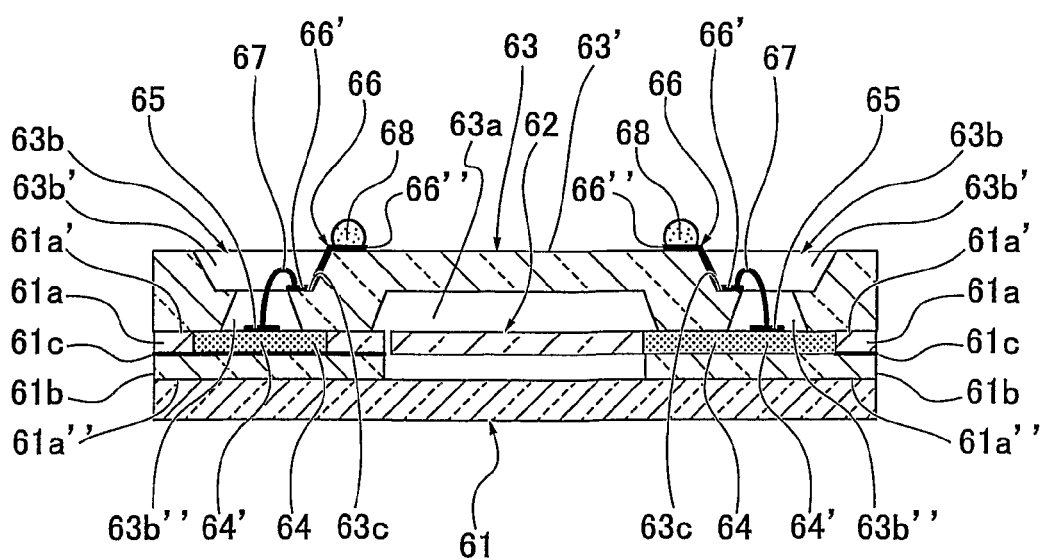
FIG. 8B is a cross sectional view thereof along the D to D' line in FIG. 8A.

FIGS. 8A, 8B are explanatory views for a functional element package according to the second embodiment of the present invention. In the drawings, silicon substrates 61a, 61b are formed in total thickness of 200 µm with a low resistance and bonded with seal members via a thermal oxide film 61c in thickness of 1 µm. A mobile portion 62 is formed on the silicon substrate 61a by cutting through the silicon substrate 61a by dry etching.

A seal member 63 covered with a not-shown thermal oxide film in thickness of 1 µm is bonded with a surface of the silicon substrate 61a via the thermal oxide film. The seal member 63 is made of a silicon substrate in thickness of 525 µm and seal-glass bonded with the silicon substrate 61a via glass frit.

The seal member 63 includes a non-rigid space (airtightly sealed space) 63a with a depth of 200 µm for the mobile portion 62 to operate, and through holes 63b to place an electrode for driving the mobile portion 62 outside the non-rigid space 63a. The non-rigid space 63a and the through holes 63b are formed by anisotropic etching in a KOH aqueous solution.

A bonding surface 61a' of the silicon substrate 61a is bonded with the seal member 63 and a bonding surface 61'' of the silicon substrate 41b on the opposite side is anodically bonded with a seal member 61 which is made of Pyrex® glass substrate with a thickness of 300 µm. The mobile portion 62 is airtightly sealed by the two seal members 63, 61, and the space inside thereof is kept depressurized.

The mobile portion 62 is connected with a wiring portion (first wiring portion) 64 which is made of the same silicon substrate with low resistance and insulated from the silicon substrates 61a, 61b by the thermal oxide film 61c and a not-shown slit in width of 50 µm penetrating through the silicon substrate 61a.

The through holes 63b are formed in a portion of the seal member excluding the non-rigid space 63a, and each composed of a large opening 63b' and a small opening 63b''. The wiring portion 64 partially extends to the outside of the non-rigid space 63a via the bonding surface 61a' of the seal member 63. The part of the wiring portion 64 extending to the outside of the non-rigid space 63a forms an upper exposed portion 64' facing the small opening 63b''. On the upper exposed portion 64' formed is an electrode pad 65 as a thin metal film which is formed by sputtering process with a metal mask.

The large opening 63b' has a tapered wall portion whose inclination angle is for example 54.7 degrees. The through holes 63b each have a step portion 63c which is formed by anisotropic etching in a KOH aqueous solution at a position 200 µm higher than the bonding surface 61a'. A connection wiring portion (second wiring portion) 66 is formed as a thin metal film from the step portion 63c to the upper surface 63' of the seal member 63 on a part of the tapered wall portion. The connection wiring portion 66 is formed by sputtering process with a metal mask.

A wiring terminal 66' on the step portion 63c is connected with the electrode pad 65 via a bonding wire 67 as a photoconductive member. Note that in the second embodiment the through hole 63b is not filled with resin to cover the bonding wire 67 unlike the first embodiment. A bump 68 made of Au—Sn alloy is formed on the wiring terminal 66' on the upper surface 63' of the seal member 43. The functional element package is mounted and bonded on a not-shown print board via the bump 68.

Next, a fabrication method for the seal member 63 with the step portion in FIGS. 8A, 8B will be described with reference to FIGS. 9A to 9J. For the sake of simplicity, FIGS. 9A to 9J show how to form a single through hole in the seal member.

Figure 9A:
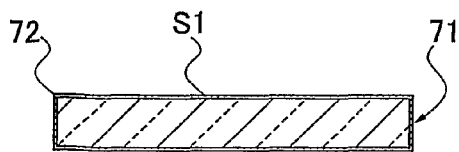
FIGS. 9A to 9J are explanatory views for fabrication process of a seal member of the functional element package according to the second embodiment of the present invention.

First, in FIG. 9A, upper and lower surfaces of silicon substrate 71 in thickness of 525 μm are mirror-polished, and then a SiN film 72 is formed thereon in thickness of 100 nm (nanometer) by low-pressure CVD using SiH4 and ammonia gas.

Figure 9F:
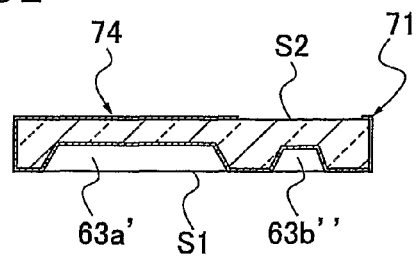
Figure 9B:
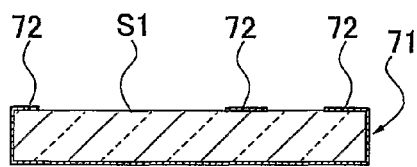
Figure 9G:
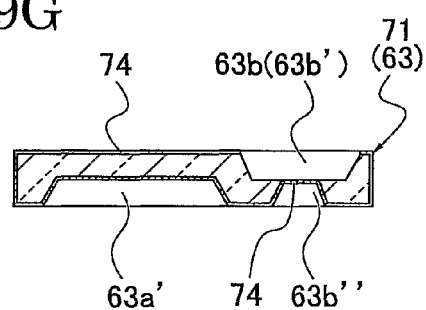

In FIG. 9B the SiN film 72 on the upper surface S1. of the silicon substrate 71 is patterned in accordance with shapes of the non-rigid space 63a and the small opening 63b".

Figure 9C:
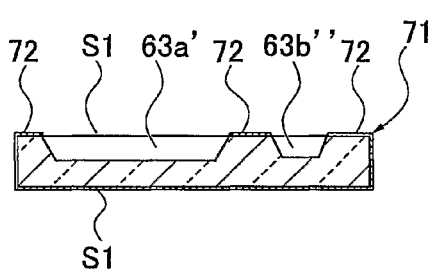

In FIG. 9C, the silicon substrate 71 undergoes the anisotropic etching in depth of 200 μm in 30 wt % KOH aqueous solution at temperature 80° C., using the SiN film 72 as a mask. Thereby, a concavity 63a' corresponding to the non-rigid space 63a and a concavity 63b" (referred to as the same numeric code as the small opening) corresponding to the small opening 63b" are formed.

Figure 9H:
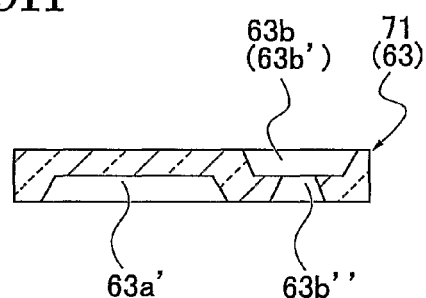
Figure 9D:
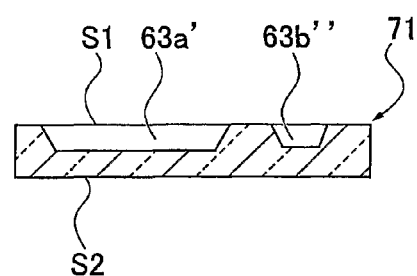

In FIG. 9D, the silicon substrate 71 is thermally phosphated to remove the SiN film 72. Then, a SiN film 74 is re-formed in thickness of 100 nm thereon by low-pressure CVD using SiH4 and ammonia gas in FIG. 9E.

Next, in FIG. 9F, the SiN film 74 on the upper and lower surfaces S1, S2 is patterned in accordance with the shape of the large opening 63b'. Then, the silicon substrate 71 undergoes the anisotropic etching in depth of 325 μm in 30 wt % KOH aqueous solution at temperature 80° C., using the SiN film 74 as a mask.

The anisotropic etching is terminated when formation of the small opening 63b" is visually confirmed. Since the SiN film 74 is formed on the through hole 63b at the termination of the etching process, boundary shapes of the large and small openings 63b', 63" can be prevented from being distorted by the etching.

Figure 9I:
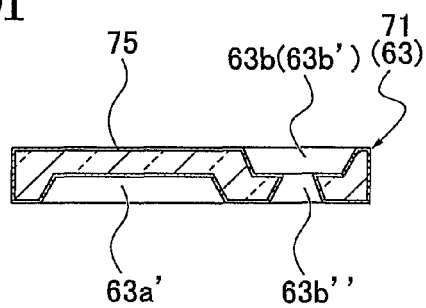
Figure 9E:
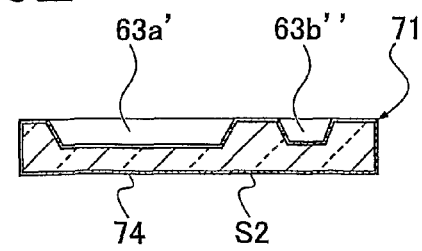
Figure 9J:
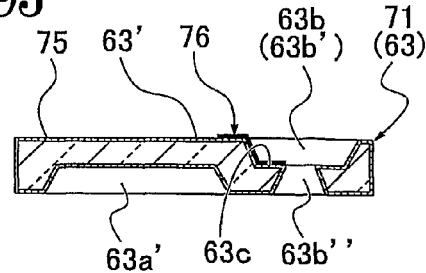

In FIG. 9H, the SiN film 74 is removed from the silicon substrate 71 by thermal phosphate process to clean the silicon substrate 71. In FIG. 9I, the silicon substrate 71 is processed in wet O$_2$ at 1000° C. to form a thermal oxide film 75 on the entire surface thereof.

Next, a connection wiring portion (second wiring portion) 76 is formed of aluminum (Al) material by sputtering from the step portion 63c of the through hole 63b to the upper surface 63' of the seal member 63. At the sputtering the seal member 63 is masked with a metal mask for prevention of film formation on an area except the connection wiring portion.

Figure 10A:
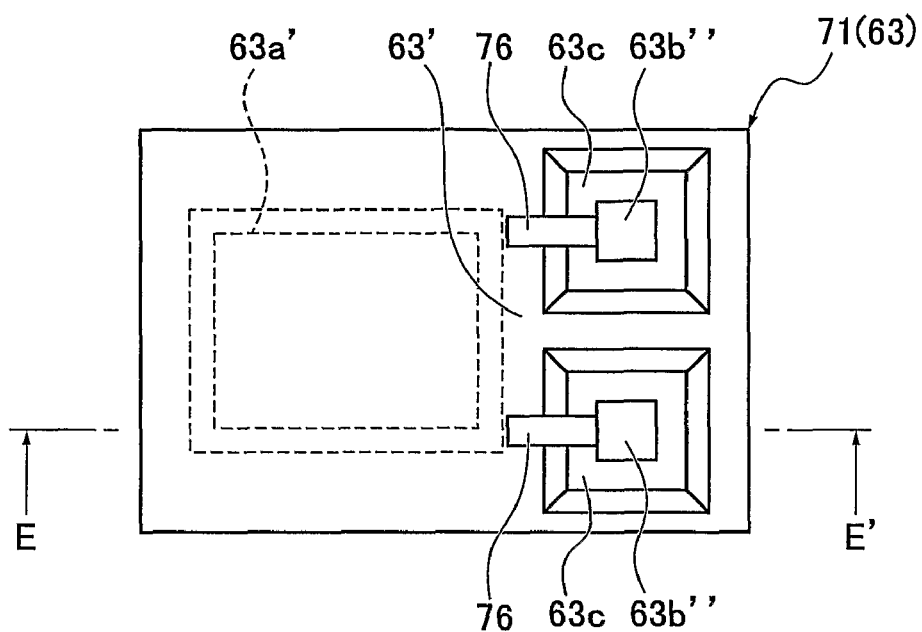
FIG. 10A shows a front surface of the seal member with a connection wiring portion of FIG. 6J, and FIG. 10B a back surface thereof.
Figure 10B:
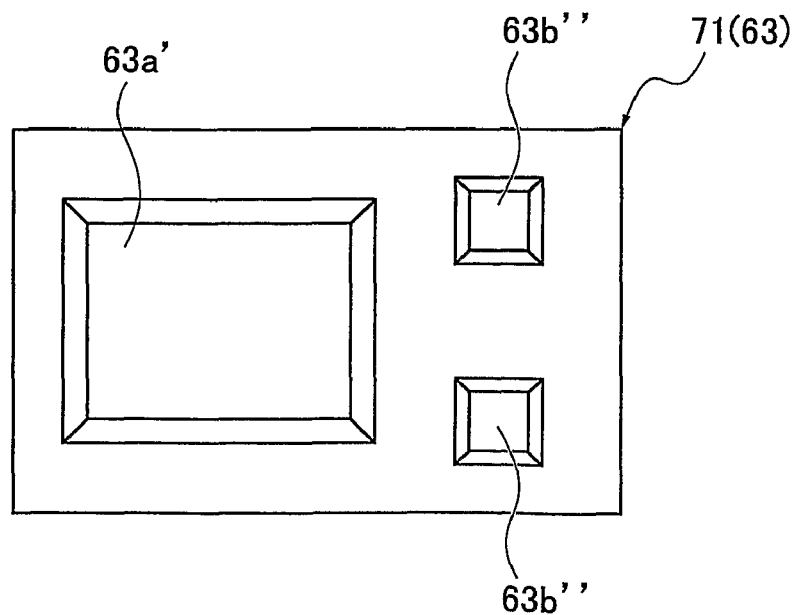

FIG. 10A shows a front surface of thus-fabricated seal member 63 and FIG. 10B shows a back surface thereof. Here, the fabricated seal member 63 is directly bonded with the silicon substrate 71 having the functional element thereon via the thermal oxide film 75. However, when flatness and cleanliness of the bonding surface 61a' can be sufficiently secured, instead of bonding them via the thermal oxide film 75, other ways of bonding, for example, bonding the seal member via an intermediate layer such as glass frit is also adoptable as long as the airtight sealing is achieved. Note that the process in which the seal member 63 is bonded with the silicon substrate 71 is the same as that in the first embodiment; therefore, the description thereon is omitted.

Third Embodiment

Figure 11:
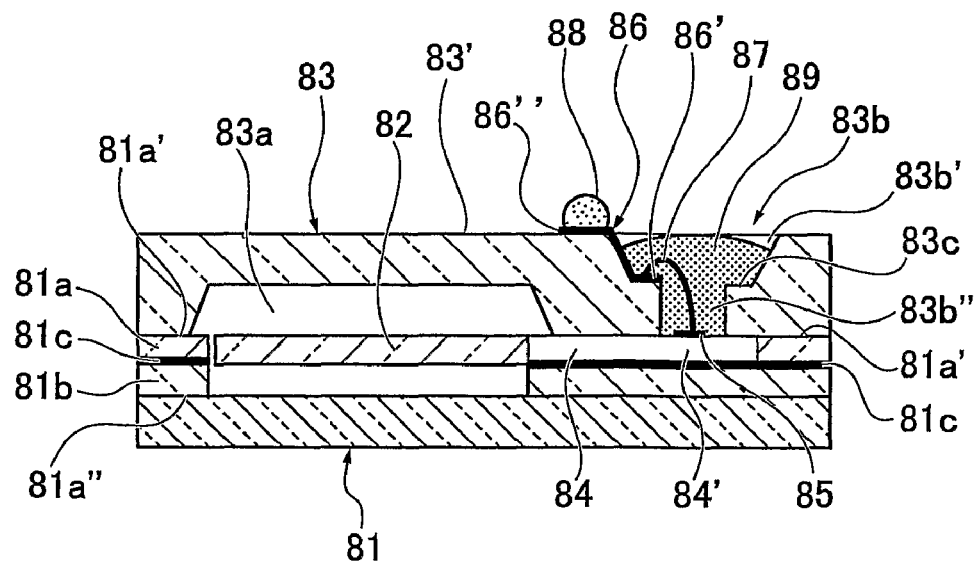
FIG. 11 shows a cross sectional structure of a functional element package according to a third embodiment of the present invention.

FIG. 11 is a cross sectional view of a functional element package according to the third embodiment of the present invention. The drawing shows silicon substrates 81a, 81b which are bonded with each other via a thermal oxide film 81c in thickness of 1 μm and have total thickness of 200 μm and a low electric resistance. A mobile portion 82 is formed on the silicon substrate 81a by cutting through the silicon substrate 81a by dry etching.

A not-shown thermal oxide film in thickness of 1 μm is formed on a seal member 83 and the seal member 83 and the silicon substrate 81a are bonded via the thermal oxide film. The seal member 83 is made of a silicon substrate in thickness of 525 μm.

The seal member 83 has a non-rigid space (airtightly sealed space) 83a with a depth of 200 μm for the mobile portion 82 to operate, and a through hole 83b to place an electrode to drive the mobile portion 82 outside the non-rigid space. The non-rigid space 83a is formed by dry etching using high-density plasma, and the through hole 83b is formed by a combination of the high-density plasma dry etching and anisotropic etching in KOH aqueous solution.

A bonding surface 81a' of the silicon substrate 81a is bonded with the seal member 83 and a bonding surface 81" of the silicon substrate 81b on the opposite side is anodically bonded with a seal member 81 which is formed of Pyrex® glass substrate with a thickness of 300 μm. The mobile portion 82 is airtightly sealed by the two seal members 83, 81 and the space inside thereof is kept depressurized.

The mobile portion 82 is connected with a wiring portion 84 (first wiring portion) which is made of a silicon substrate with the same low resistance as that of the silicon substrate 81a and insulated from the silicon substrates 81a, 81b by the thermal oxide film 81c and a not-shown slit in width of 50 μm penetrating through the silicon substrate 81a.

The through hole 83b is formed in a portion of the seal member 83 excluding the non-rigid space 83a, and composed of a large opening 83b' and a small opening 83b". The peripheral wall of the large opening 83b' is formed in inclined shape and that of the small opening 83b" is formed in vertical shape. The wiring portion 84 partially extends to the outside of the non-rigid space 83a via the bonding surface 81a' of the seal member 83. The part of the wiring portion 84 extending in the outside of the non-rigid space 83a forms an upper exposed portion 84' facing the small opening 83b". On the upper exposed portion 84' formed is an electrode pad 85 as a thin metal film which is formed by sputtering process with a metal mask.

A step portion 83c is formed on the inclined peripheral wall of the large opening 83b' at a position 200 μm higher than the bonding surface 81a' by dry etching with high-density plasma. Also, on a part of the peripheral wall from the step portion 83c to the upper surface 83' of the seal member 83, formed is a connection wiring portion (second wiring portion) 86 as a thin metal film by sputtering with a metal mask. A wiring terminal 86' of the connection wiring portion 86 on the step portion 83c is connected with the electrode pad 85 via a bonding wire 87 as a photoconductive member.

The through hole 83b is filled with a resin 89 to cover the bonding wire 87. A bump 88 made of Au—Sn alloy is formed on the wiring terminal 86' on the upper surface 83' of the seal member 83. The functional element package is mounted and bonded on a not-shown print board via the bump 88.

The seal member 83 with the step portion can be fabricated by a combination of the fabrication processes according to the first and second embodiments so that a detailed description thereon is omitted.

Fourth Embodiment

Figure 12:
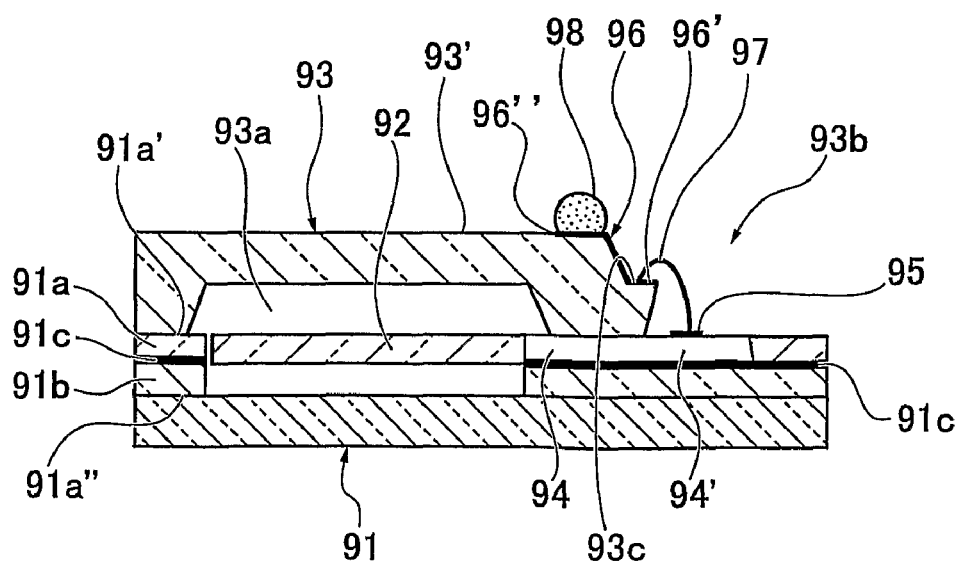
FIG. 12 shows a cross sectional structure of a functional element package according to a fourth embodiment of the present invention.

FIG. 12 is a cross sectional view of a functional element package according to the fourth embodiment, and shows silicon substrates 91*a*, 91*b* which are bonded with each other via a thermal oxide film 91*c* in thickness of 1 μm and have total thickness of 200 μm and low electric resistance.

A mobile portion 92 is formed on the silicon substrate 91*a* by cutting through the silicon substrate 91*a* by dry etching. A not-shown thermal oxide film in thickness of 1 μm is formed on a seal member 93 which is made of a silicon substrate in thickness of 525 μm. The seal member 93 is directly bonded with the surface of the silicon substrate 91*a* via the thermal oxide film.

The seal member 93 includes a non-rigid space 93*a* (airtightly sealed space) with a depth of 200 μm for the mobile portion 92 to operate. The non-rigid space 93*a* is formed by dry etching using high-density plasma. Also, it has a cutout portion 93*b* to expose to outside a later-described electrode for driving the mobile portion 92. The cutout portion 93*b* is formed by a combination of drying etching with high-density plasma and anisotropic etching in the KOH aqueous solution.

The cutout portion 93*b* can be formed by cutting and dividing with dicing means the through hole of the seal member 93 which is fabricated at a wafer level in a similar manner to that in the third embodiment. That is, two seal members 93 are formed by dividing the center of not-shown silicon substrates having concavities corresponding to the non-rigid space 93*a* at symmetric positions relative to the through hole.

A bonding surface 91*a*′ of the silicon substrate 91*a* is bonded with the seal member 93, and a bonding surface 91*a*″ of the silicon substrate 91*b* on the opposite side is anodically bonded with a seal member 91. The seal member 91 is formed of Pyrex® glass substrate with a thickness of 300 μm. The mobile portion 92 is airtightly sealed by the two seal members 93, 91, and the space inside thereof is kept depressurized.

The mobile portion 92 is connected with a wiring portion 94 (first wiring portion) made of a silicon substrate having the same low resistance as that of the silicon substrate 91*a*. The wiring portion 94 is insulated from the silicon substrates 91*a*, 91*b* by the thermal oxide film 91*c* and a not-shown slit in width of 50 μm penetrating through the silicon substrate 91*a*.

The wiring portion 94 extends from the non-rigid space 93*a* to the outside through the bonding surface 91*a*′ of the seal member 93. A part of the wiring portion 94 in the outside of the non-rigid space 93*a* forms an upper exposed portion 94′ facing the cutout portion 93*b*. An electrode pad 95 is formed as a thin metal film on the upper exposed portion by sputtering with a metal mask.

A step portion 93*c* is formed on a peripheral wall of the cutout portion 93*b* by dry etching with high-density plasma at a position 200 μm higher than the bonding surface 91*a*′. On a part of the peripheral wall of the cutout portion 93*b*, a connection wiring portion (second wiring portion) 96 is formed as a thin metal film by sputtering with a metal mask from the step portion 93*c* to the upper surface 93′ of the seal member 93.

A wiring terminal 96′ of the connection wiring portion 96 on the step portion 93*c* and the electrode pad 95 are connected with a bonding wire 97 as a photoconductive member. A bump 98 made of Au—Sn alloy is formed on a wiring terminal 96″ on the upper surface 93′ of the seal member 93. A functional element package is mounted and bonded on a not-shown print board via the bump 98.

According to the first to fourth embodiments, the functional element package can benefit from merits of both of the wire bonding with the photoconductive member and the flip-chip bonding with the bump so that it can be reliably fabricated at a low cost advantageously. Further, the photoconductive member is bent toward the airtightly sealed space to be connected with the wiring portion extending in the outside of the airtightly sealed space, and so that the photoconductive member does not extend to outside the functional element package. This can realize packaging of the function element on a minute print board with a higher density.

Fifth Embodiment

Next, another fabrication method for the seal member 63 with the inclined step portion will be described with reference to FIGS. 13A to 13F. Note that FIGS. 13A to 13F show how to fabricate a single through hole in the seal member 63 for the sake of simplicity. The same components as those in the second embodiment will be given the same numeric codes and a description thereon will be omitted.

Figure 13A:
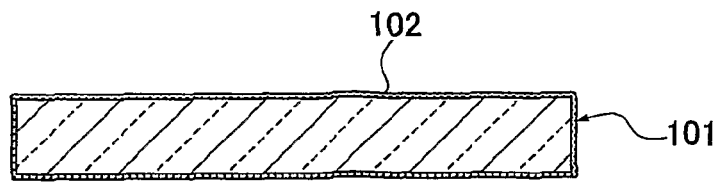
FIGS. 13A to 13F are explanatory views for fabrication process of a seal member of a functional element package according to a fifth embodiment of the present invention.

First, in FIG. 13A, upper and lower surfaces of a silicon substrate 101 in thickness of 525 μm are mirror-polished, and then a SiN film 102 is formed thereon in thickness of 100 nm (nanometer) by low-pressure CVD using SiH4 and ammonia gas.

Figure 13B:
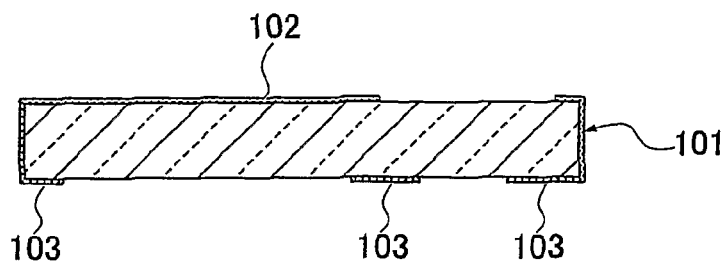

In FIG. 13B, the SiN film 102 on the upper and lower surfaces of the silicon substrate 101 is patterned using a double side mask aligner and resist in accordance with shapes of a non-rigid space 63*a*′, a through hole 63*b*′ and a packaging surface of the silicon substrate 101.

Figure 13C:
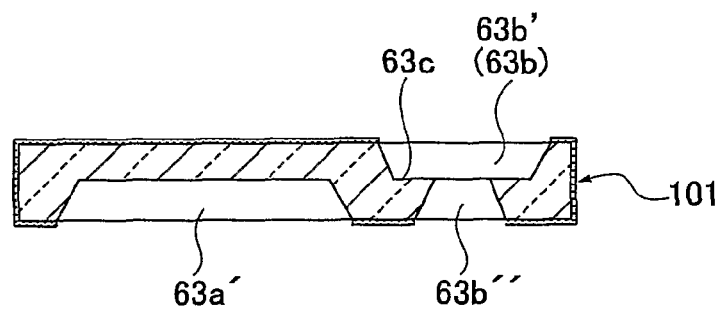

In FIG. 13C, the upper and lower surfaces of the silicon substrate 101 undergo the anisotropic etching at the same time in 30 wt % KOH aqueous solution at temperature 80° C. using the SiN film 102 as a mask, until the through hole 63*b* is formed. Here, it is preferable to design mask measurements in advance in order to make the step portion 63*c* for the wire bonding, with a distortion of the boundary shapes of the large and small openings 63*b*′, 63*b*″ at the end of the etching taken into consideration.

Figure 13D:
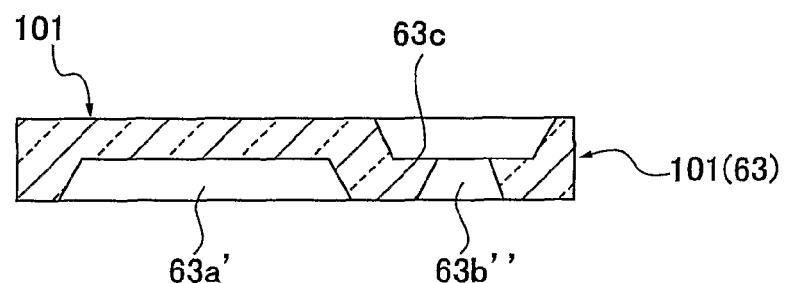
Figure 13E:
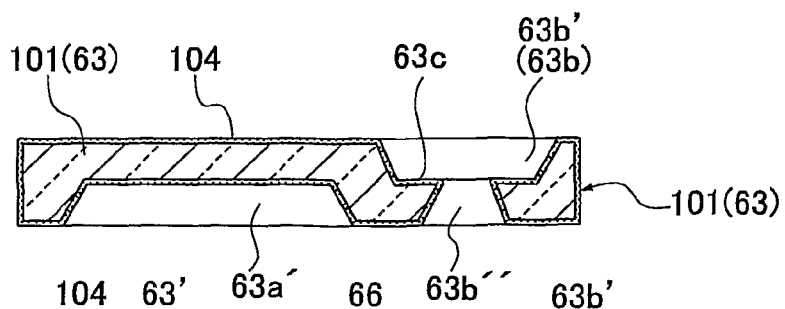
Figure 13F:
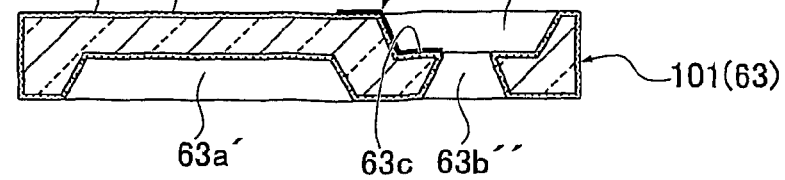

In FIG. 13D, the SiN film is entirely removed from the surfaces of the silicon substrate 101 by thermal phosphate process to clean the silicon substrate 101 with the trough hole 63*b* and concavity 63*a*′ formed. Then, in FIG. 13E, the silicon substrate 101 is processed in wet $O_2$ at 1000° C., to form a thermal oxide film 104 on the entire surface thereof and complete the seal member 63. Lastly, in FIG. 13F a connection wiring portion 66 is formed from the step portion 63*c* of the through hole 63*b* to the upper surface 63′ of the seal member 63 by sputtering with a metal mask.

Note that the following processes to connect the thus-fabricated seal member 63 with the silicon substrate having the functional element thereon are the same as those in the first embodiment, therefore, a detailed description will be omitted.

Sixth Embodiment

Figure 14A:
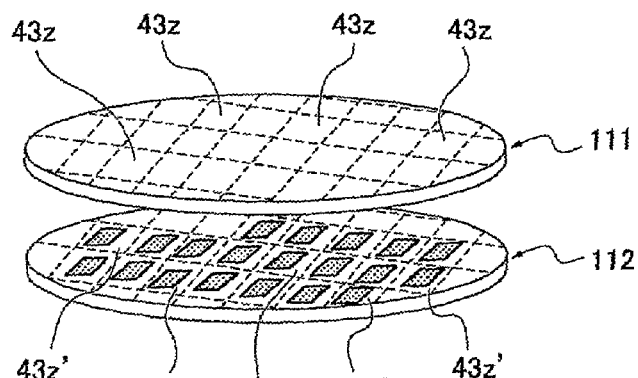
FIGS. 14A to 14B are explanatory views for fabrication process of a seal member of a functional element package according to a sixth embodiment of the present invention, FIG. 14A obliquely shows a circular wafer having a large number of seal members thereon and a circular wafer having a large number of microstructures thereon before they are bonded.
Figure 14B:
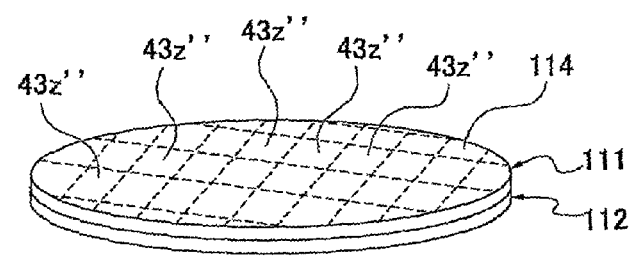
Figure 15:
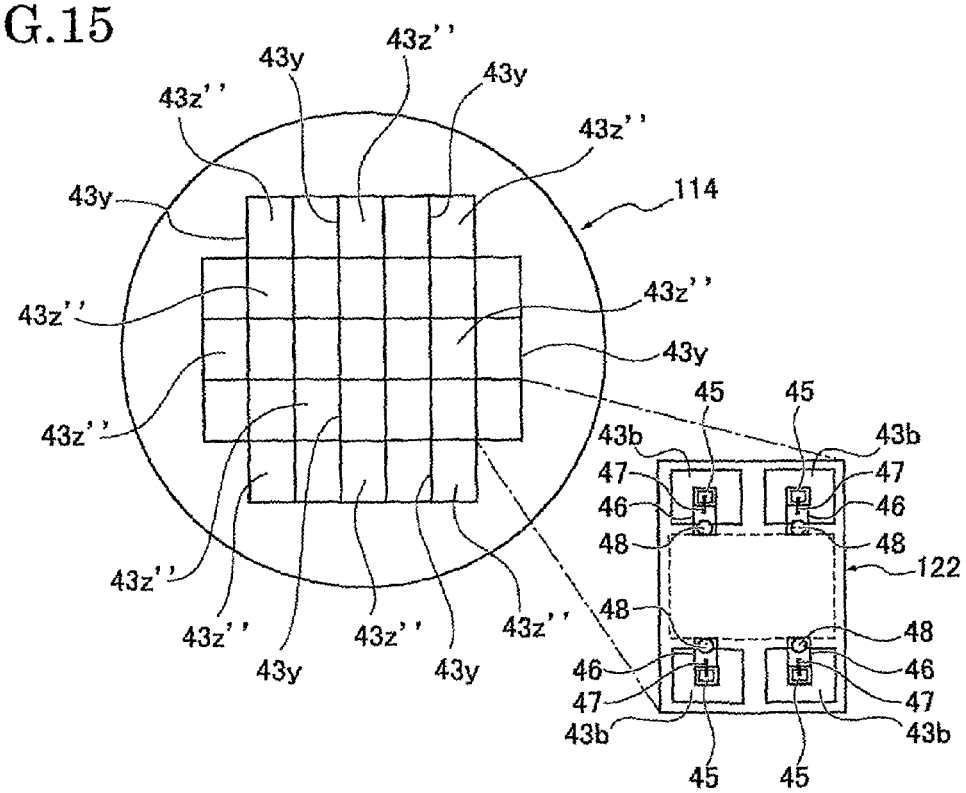
FIG. 15 is a plain view of the bonded wafer in FIG. 14B and a single enlarged seal member.

FIGS. 14A, 14B and FIG. 15 are explanatory views for bonding a seal member 43 with a silicon substrate at a wafer level to fabricate a functional element package. FIGS. 14A, 14B show a circular wafer 111 on which a large number of regions 43*z* each equivalent to the seal member 43 are formed. The drawings omit showing microstructures such as the airtightly sealed space 43*a*, through hole 43*b* of FIG. 4A formed on each region 43*z*. Similarly, FIGS. 14A, 14B show a circular wafer 112 on which a large number of regions 43*z*′ each equivalent to the silicon substrates, 41*a*, 41*b*, and seal member 41 of FIG. 4B are formed. The drawings omit showing microstructures such as the mobile portion 42, wiring portion 44 formed on the silicon substrate 41*a*.

The circular wafers 111,112 are bonded and airtightly sealed with each other in a pressure adjusted space, forming a bonded wafer 114 with a large number of functional element packages 43z" shown in FIG. 14B. By cutting the bonded wafer 114 along contours 43y of the functional element packages 43z" by dicing means or cleavage means, a large number of functional element packages 122 can be collectively formed. FIG. 15 shows a single enlarged functional element package 122.

As described above, the present embodiment enables further fabrication cost reduction by bonding the seal members 43 with the silicon substrate at a wafer level.

INDUSTRIAL AVAILABILITY

The functional element package according to the present invention is applicable to MEMS devices fabricated through silicon micromachining process and mounted on a print board or the like for use in optical scanners used for digital copiers, laser printers, or reading apparatuses as barcode readers, scanners or the like.

Although the present invention has been described in terms of exemplary embodiments, it is not limited thereto. It should be appreciated that variations may be made in the embodiments described by persons skilled in the art without departing from the scope of the present invention as defined by the following claims.

The invention claimed is:

1. A functional element package comprising:
a silicon substrate on which a functional element is formed, the functional element having one of a mobile portion and a sensor;
a seal member bonded with the silicon substrate to airtightly seal the functional element and form an airtightly sealed space therein, and including a step portion in its height direction;
a first wiring portion connected with the functional element and extending from the airtightly sealed space to an outside thereof;
a second wiring portion being different from the first wiring portion and extending from the step portion to an upper surface of the seal member; and
a bump on the second wiring portion on the upper surface of the seal member, wherein
the first wiring portion extending to the outside is bent towards the airtightly sealed space and connected via a conductive member with the second wiring portion on the step portion, and the conductive member is connected with the second wiring portion on a part of the step portion other than the upper surface of the seal member.

2. A functional element package according to claim 1, wherein the photoconductive member is a bonding wire.

3. A functional element package according to claim 2, wherein the seal member has an inclined peripheral wall from the upper surface to the step portion.

4. A functional element package according to claim 2, wherein the seal member has an inclined peripheral wall from the upper surface to the step portion, and a vertical peripheral wall from the step portion to an upper exposed portion of the first wiring portion.

5. A functional element package according to claim 2, wherein the step portion is formed at an end of the seal member.

6. A functional element package according to claim 2, wherein:
the seal member has a through hole; and
the step portion is formed around the through hole.

7. A functional element package according to claim 6, wherein:
the bonding wire to connect the second wiring portion on the step portion with the first wiring portion is protected with a resin material; and
the resin material is filled into the through hole so as not to protrude from the upper surface of the seal member.

8. A functional element package according to claim 1, wherein the seal member is made of glass.

9. A functional element package according to claim 1, wherein the seal member is made of a silicon material.

10. A functional element package according to claim 1, wherein the airtightly sealed space is depressurized.

11. A functional element package according to claim 1, wherein the airtightly sealed space is filled with inert gas.

12. A functional element package according to claim 1, wherein the silicon substrate on which the functional element is formed is bonded with the seal member via an intermediate adhesive layer.

13. A functional element package according to claim 1, wherein the silicon substrate on which the functional element is formed is directly bonded with the seal member.

14. A fabrication method for a functional element package comprising: a silicon substrate on which a functional element is formed, the functional element having one of a mobile portion and a sensor; a seal member bonded with the silicon substrate to airtightly seal the functional element and form an airtightly sealed space therein, and including a step portion in its height direction; a first wiring portion connected with the functional element and extending from the airtightly sealed space to an outside thereof; a second wiring portion being different from the first wiring portion and extending from the step portion to an upper surface of the seal member ; and a bump on the second wiring portion on the upper surface of the seal member, wherein the first wiring portion extending in the outside is bent towards the airtightly sealed space and connected via a photoconductive member with the second wiring portion on the step portion, the method comprising the steps of:
forming an inclined peripheral wall of the seal member from the upper surface to the step portion by anisotropic wet etching; and
connecting the conductive member with the second wiring portion on a part of the step portion other than the upper surface of the seal member.

15. A fabrication method for a functional element package according to claim 14, further comprising the step of:
concurrently forming the airtightly sealed space and the step portion by silicon anisotropic etching.

16. A fabrication method for a functional element package, comprising the steps of:
fabricating a bonded wafer having a large number of functional element packages thereon by bonding a wafer on which a large number of seal members according to claim 1 are formed and a wafer on which a large number of microstructures including a functional element are formed; and
cutting the bonded wafer along contours of the functional element packages.

17. The functional element package according to claim 1, wherein the step portion is external to the airtightly sealed space.

* * * * *